United States Patent
Roberts et al.

(10) Patent No.: US 9,692,408 B2
(45) Date of Patent: Jun. 27, 2017

(54) DEVICES AND SYSTEMS COMPRISING DRIVERS FOR POWER CONVERSION CIRCUITS

(71) Applicant: GaN Systems Inc., Ottawa (CA)

(72) Inventors: John Roberts, Kanata (CA); Greg P. Klowak, Ottawa (CA)

(73) Assignee: GaN Systems Inc., Ottawa (CA)

( * ) Notice: Subject to any disclaimer, the term of this patent is extended or adjusted under 35 U.S.C. 154(b) by 65 days.

(21) Appl. No.: 14/654,127

(22) PCT Filed: Dec. 12, 2013

(86) PCT No.: PCT/CA2013/001019
§ 371 (c)(1),
(2) Date: Jun. 19, 2015

(87) PCT Pub. No.: WO2014/094115
PCT Pub. Date: Jun. 26, 2014

(65) Prior Publication Data
US 2015/0318851 A1    Nov. 5, 2015

Related U.S. Application Data

(60) Provisional application No. 61/740,825, filed on Dec. 21, 2012, provisional application No. 61/740,821, filed on Dec. 21, 2012.

(51) Int. Cl.
*H03K 3/00*   (2006.01)
*H03K 17/687*   (2006.01)
(Continued)

(52) U.S. Cl.
CPC ..... *H03K 17/687* (2013.01); *H01L 23/49524* (2013.01); *H01L 23/49562* (2013.01);
(Continued)

(58) Field of Classification Search
None
See application file for complete search history.

(56) References Cited

U.S. PATENT DOCUMENTS 5,905,617 A * 5/1999 Kawasoe ............. H03F 1/52
330/207 P
6,972,625 B2  12/2005 Nguyen et al.
(Continued)

OTHER PUBLICATIONS

International Search Report; PCT/CA2013/001019; 4 pages.

*Primary Examiner* — Lincoln Donovan
*Assistant Examiner* — Khareem E Almo
(74) *Attorney, Agent, or Firm* — Miltons IP/p.i.

(57) ABSTRACT

An electronic switching system and device comprising driver circuits for power transistors are disclosed, with particular application for MOSFET driven, normally-on gallium nitride (GaN) power transistors. Preferably, a low power, high speed CMOS driver circuit with an integrated low voltage, lateral MOSFET driver is series coupled, in a hybrid cascode arrangement, to a high voltage GaN HEMT and provides for improved control of noise and voltage transients. Monitoring and control functions, including latching and clamping, are based on monitoring of $V_{cc}$ conditions for shut-down and start-up conditioning to enable safer operation, particularly for high voltage and high current switching. Preferred embodiments also provide isolated, self-powered, high speed driver devices, with reduced input losses.

33 Claims, 6 Drawing Sheets

(51) Int. Cl.
    *H01L 25/18* (2006.01)
    *H01L 23/495* (2006.01)
    *H01F 19/08* (2006.01)
    *H01L 23/64* (2006.01)
    *H01L 23/00* (2006.01)

(52) U.S. Cl.
    CPC ........ *H01L 23/49575* (2013.01); *H01L 24/06* (2013.01); *H01L 25/18* (2013.01); *H01F 19/08* (2013.01); *H01L 23/49548* (2013.01); *H01L 23/645* (2013.01); *H01L 24/05* (2013.01); *H01L 24/13* (2013.01); *H01L 24/16* (2013.01); *H01L 24/32* (2013.01); *H01L 24/48* (2013.01); *H01L 24/49* (2013.01); *H01L 24/73* (2013.01); *H01L 2224/0401* (2013.01); *H01L 2224/04042* (2013.01); *H01L 2224/0557* (2013.01); *H01L 2224/05554* (2013.01); *H01L 2224/05555* (2013.01); *H01L 2224/06051* (2013.01); *H01L 2224/06131* (2013.01); *H01L 2224/06181* (2013.01); *H01L 2224/13147* (2013.01); *H01L 2224/16145* (2013.01); *H01L 2224/32245* (2013.01); *H01L 2224/48137* (2013.01); *H01L 2224/48195* (2013.01); *H01L 2224/48247* (2013.01); *H01L 2224/49107* (2013.01); *H01L 2224/49175* (2013.01); *H01L 2224/73253* (2013.01); *H01L 2224/73265* (2013.01); *H01L 2924/00014* (2013.01); *H01L 2924/1033* (2013.01); *H01L 2924/10253* (2013.01); *H01L 2924/10272* (2013.01); *H01L 2924/1204* (2013.01); *H01L 2924/12035* (2013.01); *H01L 2924/1305* (2013.01); *H01L 2924/1306* (2013.01); *H01L 2924/13064* (2013.01); *H01L 2924/13091* (2013.01); *H01L 2924/15747* (2013.01); *H01L 2924/181* (2013.01); *H01L 2924/19104* (2013.01); *H01L 2924/30107* (2013.01)

(56) References Cited

U.S. PATENT DOCUMENTS

| | | | |
|---|---|---|---|
| 7,696,823 B2 | 4/2010 | Khorramabadi | |
| 7,848,724 B2 | 12/2010 | Bult et al. | |
| 2013/0027082 A1* | 1/2013 | Sofer | H03K 3/356113 326/80 |
| 2015/0042394 A1* | 2/2015 | Hwang | H03K 6/02 327/333 |
| 2015/0318851 A1* | 11/2015 | Roberts | H01L 25/18 327/109 |
| 2016/0094226 A1* | 3/2016 | Wang | H03K 19/017509 307/130 |
| 2016/0266175 A1* | 9/2016 | Nizza | H03K 17/6871 |

* cited by examiner

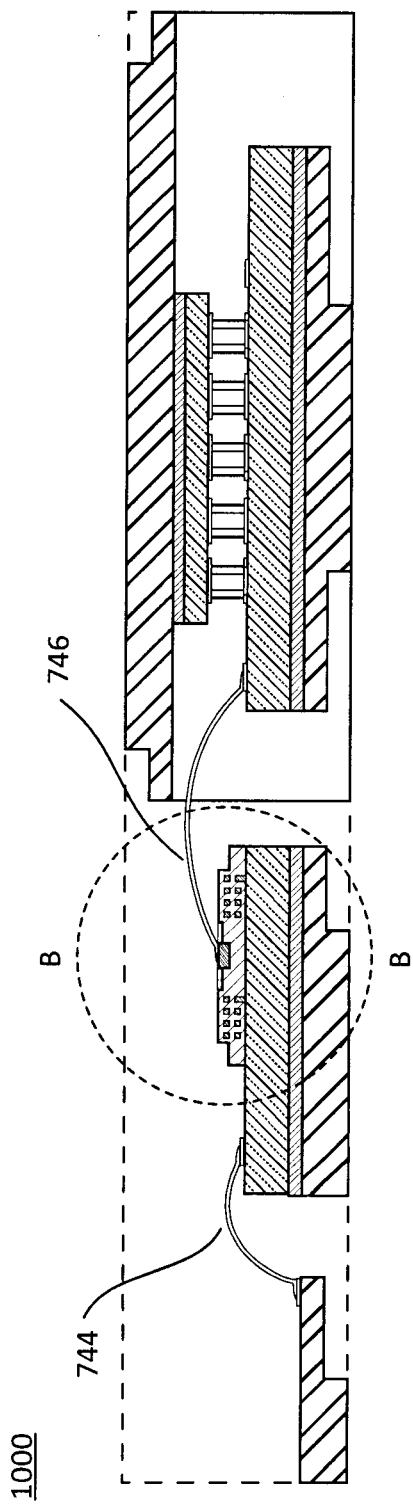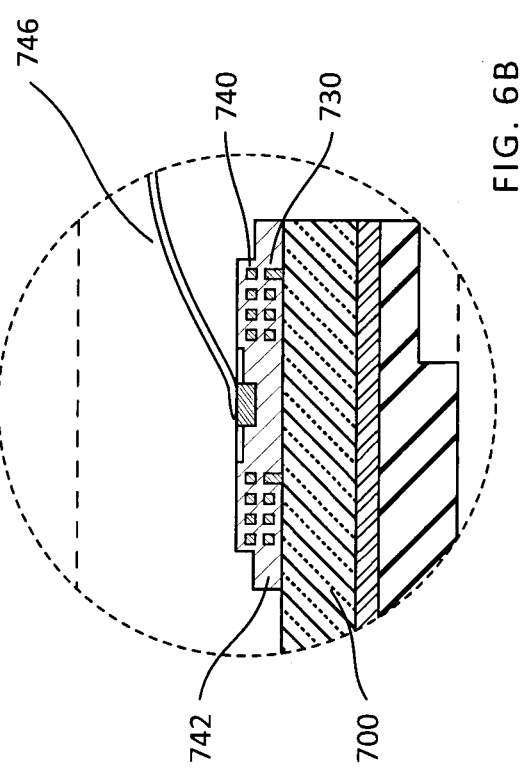
FIG. 6A
FIG. 6B

DEVICES AND SYSTEMS COMPRISING DRIVERS FOR POWER CONVERSION CIRCUITS

CROSS-REFERENCE TO RELATED APPLICATION(S)

This application is the national phase entry of International Application No. PCT/CA2013/001019 filed 12 Dec. 2013, entitled "Devices and Systems for Power Conversion Circuits" and claims priority from U.S. Provisional patent application No. 61/740,825, filed 21 Dec. 2012, entitled "Devices and Systems for Power Conversion Circuits" and from U.S. provisional patent application No. 61/740,821, filed 21 Dec. 2012, entitled "Devices and Systems for Power Conversion"; all of which are incorporated herein by reference in their entirety.

TECHNICAL FIELD

This invention relates to devices and systems for electronic power conversion circuits, and more particularly relates to devices and systems comprising driver circuits for high frequency, switched mode, power conversion circuits, using high performance power transistors, such as, gallium nitride high electron mobility transistors (GaN HEMTs).

BACKGROUND ART

Semiconductor devices based on gallium nitride (GaN) technology offer significant advantages over silicon technology for power electronic systems. GaN and its alloys, such as aluminum gallium nitride (AlGaN), are direct, wide band gap semiconductor materials, which have applications for microelectronic devices, including diodes and transistors for microwave and power switching circuits, as well as optoelectronics.

For power devices, GaN offers high dielectric strength, high operating temperature, high current density, high speed switching and low on-resistance. Compared to silicon, GaN has ten times the electrical breakdown strength, three times the band gap, and exceptional carrier mobility. These properties enable transistors to be produced with an on-resistance lower than attainable with silicon technology, even better than a mechanical relay contact, and allows for diodes providing a near-zero forward voltage drop. These features, together with inherently negligible charge storage, permit the design of power switching circuits with higher efficiency, smaller size and lower heat losses.

For example, as disclosed in copending PCT International patent application no. PCT/CA2012/000080 entitled "Gallium nitride power devices using island topography" (and related applications, having common ownership and inventorship with this application), GaN transistors with ultra-low on-resistance can be produced using Island Topology™. This topology provides a compact structure with a gate width double that of a conventional multi-finger design of a similar device size, with superior current handling per unit area. A breakdown voltage exceeding 1200V can be achieved.

GaN power transistors for power conversion circuits for high voltage (HV) applications, e.g. 600/650V, are typically normally-on (depletion mode) transistors. These transistors are usually driven by a series connected, discrete, power MOSFET device, i.e. in a cascode configuration, to provide normally-off operation (see FIG. 1). Conventionally, the hybrid cascode arrangement is provided with a separate, high power, high speed driver circuit, having a separate isolated power supply.

This type of hybrid cascode arrangement can provide a positive threshold voltage and further enhancement of the high Figure of Merit (FOM) of a high voltage GaN transistor. However, issues caused by transient voltages and heat dissipation can detract from performance and these issues also create challenges for the design of the driver circuit. The overall performance of hybrid cascode arrangements using existing driver circuits falls short of the potential capabilities of an individual GaN transistor.

The GaN transistor may be required, for example, to provide <20 ns switching time and more than 30 A current switching capability. Any significant series inductance at the MOSFET source or at the common node will provide unwanted L di/dt transients which can be as large as the threshold voltage of the devices, thus causing unwanted switching. It will be appreciated that in operation of an electronic power switching system that is capable of switching, for example, 30 Amps at 1000V, i.e. 30,000 Watts, safe operation may be compromised by any unwanted switching caused by transients or noise that exceeds the threshold voltage of the device.

Additionally, series resistance in the source connection results in debiasing which produces an apparent increase in the on-resistance. Thus, in conventional systems, the driver MOSFET is typically a discrete, oversized driver MOSFET that is rated to withstand ten times the static voltage stress.

To implement the series cascode connection of the two transistors and achieve high speed with low losses, the GaN transistor and a discrete vertical MOSFET are co-packaged using multiple wire bonded connections. Wire bonding is expensive, area consuming, and cumbersome. Additionally, the wire bonded interconnects represent significant inductance that contributes to high frequency switching transients and unnecessary power loss, particularly for switching speeds in the order of 100V/ns.

To reduce the inductance of the connections between the GaN transistor and the MOSFET, the two transistors are physically arranged and packaged in close proximity, to reduce interconnect length. This arrangement then presents problems for thermal management.

Thus, conventional cascode arrangements of a GaN power transistor and a discrete driver MOSFET require complex and costly driver circuitry to manage issues with transient voltages.

Improvements or alternative solutions are needed to address issues with series inductance and resistance, reduce or manage unwanted noise and voltage transients, and enable lower cost and more compact systems and devices for electronic power conversion circuits, particularly those using hybrid cascode arrangements of a normally-on GaN power transistor and a driver MOSFET.

The present invention seeks to overcome, or mitigate, one or more of the above mentioned disadvantages or limitations of these known systems and devices for electronic power conversion circuits, or at least provide an alternative.

SUMMARY OF INVENTION

Aspects of the invention provide systems and devices for power conversion circuits using high voltage power transistors, including systems and devices comprising a driver circuit providing monitoring and control functions for control of noise and transients. These devices and systems have particular application for power conversion circuits using a hybrid cascode arrangement of a high voltage normally-on (depletion mode) GaN power transistor and a low voltage driver MOSFET, such as used in high frequency, switched mode, power conversion circuits, using high performance power transistors, and particularly, gallium nitride high electron mobility transistors (GaN HEMTs).

Thus, one aspect of the invention provides a driver circuit for a hybrid cascode arrangement 100 of a normally-on (depletion mode) power transistor 114 driven by a normally-off driver FET 112, the driver circuit 200/300 comprising:
a differential control signal input 204;
a control signal output 206 for coupling to the gate 120 of the driver FET 112;
the differential control signal inputs being coupled through an isolator 210 to differential input means 220;
the output of the differential input means 220 being coupled through monitoring and control means 230 to a pre-driver 260 providing the control signal output 206;
a power source for supplying an operational supply voltage Vcc, Vcc'; and
the monitoring and control means 230 comprising latch means 240 and clamp means 250 configured to:
during power-off, clamp the output control signal to maintain the driver FET off;
monitor Vcc and Vcc' inputs from the power source;
enable switching of the driver FET only when Vcc and Vcc' inputs indicative of operational Vcc, Vcc' conditions are received; and
otherwise lockout switching of the driver FET.

The driver circuit is suitable for providing a gate control signal to a driver FET for a normally-on GaN power transistor such as a GaN MISFET or GaN HEMT. The circuit is readily driven from logic signals and provides monitoring and control functionality for control of noise and voltage transients, to reduce unwanted switching. This arrangement provides for power-up and power-down conditioning.

In particular, embodiments of the driver circuit are disclosed that provide for improved monitoring and control of noise and voltage transients, thereby enabling a smaller, low voltage driver FET to be used. Thus, beneficially, the driver FET may comprise a low voltage driver MOSFET, which can be integrated with the driver circuit on the same substrate. More preferably, the driver circuit comprises a CMOS circuit and the driver MOSFET comprises a lateral N-channel MOSFET (NMOSFET) that can be fabricated by a standard CMOS process and thus, fully integrated with the driver circuit, on the same substrate (i.e. a CMOS die).

When the CMOS driver circuit and integrated driver MOSFET are designed for low power operation, the circuit is preferably self-powered. The power source is preferably an internal power source that is coupled to differential inputs A, B and the common node Cn of the cascode arrangement. The power source is configured to draw power internally from one or both of these sources, referred to as power "harvesting". This arrangement eliminates the need for a separate isolated power supply.

The differential input means may comprise a Schmitt trigger differential input, e.g. to clean up signal edges and reduce noise. The latch means comprises latch circuitry comprising, for example, data storage D type latches. The latch receives differential input control signals A and B, from the differential input circuitry, and the latch is configured such that non-differential (unbalanced) inputs A and B to the latch means produce no change in the output control signal, i.e. so that there is no low/high transition to the gate of the driver FET. The latch may further receive an input L from the clamp, and the latch is configured such that, unless an input L indicative of operational Vcc and Vcc' conditions is received, no change in the output control signal is produced, i.e. so that there is no low/high transition to the gate of the driver FET.

In a preferred embodiment, the output control signal of the latch is based on a truth table, e.g. as shown in FIG. 3, wherein A and B are the differential control signal inputs and L is the input from the clamp means.

The clamp means comprises, for example, clamp circuitry comprising a negative charge pump and a plurality of normally-on transistor clamps, the normally-on transistor clamps being coupled respectively to the control signal output of the pre-driver, an input of the pre-driver and a latch input of the latch means. The negative charge pump receives inputs Vcc and Vcc" and provides outputs to gates of the transistor clamps based on the Vcc and Vcc" inputs, to enable switching off of the transistor clamps only when operational Vcc and Vcc" conditions are established. The clamp speed is matched to the speed of the device. Thus, unless operational Vcc conditions are established, the control signal output from the pre-driver is held low, and the latch input L to the latch circuitry is held low, to prevent switching on of the driver FET. Thus, the drive circuitry provides improved management of transients. Monitoring and control circuitry provides latch functionality to bring another level of switching control, e.g. for improved safety for high voltage, high current switching.

Advantageously, for isolation, the isolator comprises a coreless/air core isolation pulse transformer coupling. While other isolators may be used, the transformer coupling allows power to be drawn from edge transitions of the differential inputs A and B. That is, the power source of the driver circuit is configured to draw power from edge transitions of differential inputs A, B from the transformer coupling. Additionally or alternatively, the driver circuit is configured to draw power from the common node Cn of the hybrid cascode arrangement, i.e. from edge transitions of common node transitions. For example, the power source comprises a rectifier configured to receive differential inputs A and B from the transformer coupling, such that cycling of differential inputs A and B to provide non-differential edge transitions, between 00 and 11, provides a narrow pulse and carrier signal to generate supply voltage outputs Vcc and Vcc'. The latch circuitry functions to ensure the output control signal is unchanged during such non-differential edge transitions, and also during power up.

The clamp circuitry ensures that the output control signal is kept low until operational Vcc power conditions are established. At power up, edge transitions of the differential inputs A and B provide sufficient power to maintain operational status of the driver circuit. During operation, significant power may also be drawn from transitions at the common node Cn, i.e. to provide the charge requirement to the gate of the driver MOSFET. The input pulse frequency is selected dependent on power requirements, e.g. to generate a 3V supply.

Thus, a CMOS driver circuit can be provided with an integrated, internal power source, avoiding the need for a separate isolated power supply. The power source can provide the necessary power to run a low voltage CMOS circuit and low voltage driver MOSFET. If required, e.g. to provide a higher drive voltage to the gate of the driver MOSFET, the power source may further comprise a charge pump.

If required, the monitoring and control means may further comprise means for clamping the common node Cn of the driver FET, i.e. to prevent the Cn voltage rising too high.

Another aspect of the invention provides a system comprising: a cascode arrangement 100 of a normally-on depletion mode high voltage power transistor 114 driven by a normally-off drive FET 112; and a driver circuit 200 as defined herein. Preferably, the power transistor comprises a hybrid cascode arrangement of a HV normally-on, depletion mode HV GaN power transistor and a normally-off, large MOSFET.

The power transistor preferably comprises a high performance normally-on HV GaN HEMT. Alternatively, the power transistor comprises a HV GaN MISFET.

Advantageously, the driver circuit comprises a CMOS integrated circuit and the driver FET comprises a low voltage MOSFET, e.g. a lateral N-channel MOSFET monolithically integrated with the CMOS driver circuit. In alternative embodiments, the driver FET may alternatively be a LV normally-off GaN FET.

Accordingly, embodiments of the invention are disclosed that provide devices and systems comprising a gate driver circuit for a power transistor, and preferably comprising a low power CMOS driver circuit with an integrated driver MOSFET, for high speed operation. The driver circuit provides for more complex control and monitoring of the power transistor. The driver circuit is configured to reduced noise and reduces unwanted voltage transients, using latch and clamp control circuitry based on monitoring Vcc conditions. It provides for power-up and power-down conditioning for safer operation. Isolation is preferably provided by an isolation transformer coupling, to enable power harvesting from edge transitions using an integrated power source. This arrangement eliminates the need for a separate isolated power source.

Another aspect of the invention provides a method for driving a power transistor comprising a cascode arrangement of a normally-on high voltage power transistor and a normally-off low voltage driver FET, comprising: generating in a driver circuit a gate control signal for the driver FET by steps comprising: receiving differential input control signals A and B generating pulses comprising differential and non-differential edge transitions; coupling input control signals A and B to power harvesting means for generating, from pulses comprising non-differential edge transitions, a supply voltage Vcc, Vcc' for the driver circuit; and coupling input control signals A and B to latch means for generating, from differential edge transitions, an output gate control signal for controlling switching of the driver MOSFET.

Also provided is a method for generating an output control signal for driving the gate of a power transistor, comprising the steps of: generating differential control signals A and B comprising a series of pulses comprising differential (unbalanced) edge transitions and non-differential (balanced) edge transitions; providing to differential input circuitry, through input isolation means, the differential control signals A and B; coupling inputs A and B to power harvesting means and generating from pulses comprising non-differential or differential edge transitions a supply voltage Vcc and Vcc'; coupling inputs A and B to latch means for extracting (deriving), from differential edge transitions, a switching control signal; and coupling the switching control signal through a pre-driver for driving the gate of the power transistor.

The method may further comprise monitoring Vcc, Vcc'; and outputting from the pre-driver, a switching control signal dependent on Vcc and Vcc' inputs: during power off, clamping the switching control signal to maintain the power transistor off; enabling output of a switching control signal for switching of the power transistor only when Vcc and Vcc' inputs indicative of operational Vcc, Vcc' conditions are received; and otherwise clamping the switching control signal.

Yet another aspect of the invention provides a system for generating an output control signal for driving the gate of a power transistor comprising: means for generating differential input control signals A and B comprising a series of pulses comprising differential (unbalanced) edge transitions and non-differential (balanced) edge transitions; input isolation means for receiving differential input control signals A and B; power harvesting means for receiving inputs A and B and generating from pulses comprising non-differential edge transitions a supply voltage Vcc and Vcc'; latch means for receiving inputs A and B and extracting (deriving) from differential edge transitions a switching control signal; and a pre-driver means for coupling the switching control signal to the gate of the power transistor.

Also provided is an interface circuit for the driver circuit, comprising: a pulse generator for generating the differential input control signals for the driver circuit and an isolator, such as an isolation transformer coupling for coupling the input signals to the driver circuit.

Thus, devices and systems are provided comprising a driver circuit for a power transistor of a power conversion circuit. Advantageously, preferred embodiments of a low power CMOS driver circuit comprise an integrated driver MOSFET and mitigate or circumvent one or more limitations of known devices and systems.

BRIEF DESCRIPTION OF THE DRAWINGS

In the drawings, identical or corresponding elements in the different Figures have the same reference numeral, or corresponding elements have reference numerals incremented by 100 in successive Figures.

FIG. 6 shows a cross-sectional view through an assembly of the GaN die comprising a GaN HEMT, the CMOS driver die comprising an integrated driver MOSFET, and the interface circuit with isolation transformer coupling; and FIG. 6B shows an enlarged cross-sectional view showing details of the transformer coupling.

The foregoing and other objects, features, aspects and advantages of the present invention will become more apparent from the following detailed description, taken in conjunction with the accompanying drawings, of preferred embodiments of the invention, which description is by way of example only.

DETAILED DESCRIPTION OF PREFERRED EMBODIMENTS

A system 10 comprising a driver for a GaN switching device according to an embodiment of the invention will be described with reference to FIGS. 1 to 5. The system 10 comprises an isolated, self-powered driver fabricated as a CMOS circuit that can be integrated with a driver MOSFET 112 of a hybrid cascode arrangement 100 comprising a normally-on (depletion mode) GaN transistor 114, as illustrated in FIG. 1.

Hybrid Cascode Arrangement

Figure 1B:
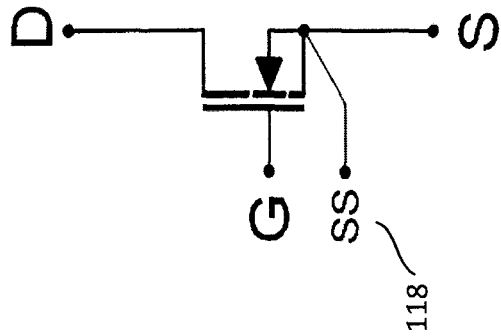
FIG. 1B shows the equivalent circuit represented as a single high voltage power transistor.
Figure 1A:
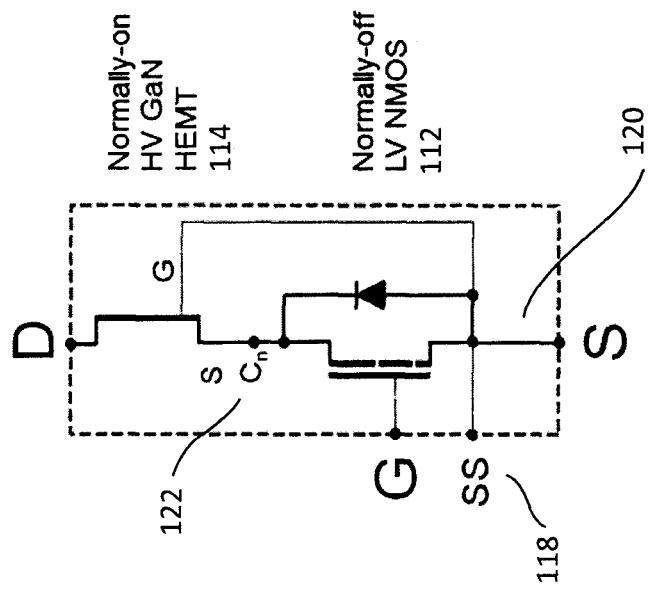
FIG. 1A shows a circuit schematic for a device comprising a cascode arrangement of a normally-on (depletion mode) HV power transistor and a normally-off LV MOSFET driver transistor.

A circuit 100 comprising a hybrid cascode arrangement of a normally-on depletion mode GaN FET power transistor 114 and a normally-off driver FET 112 is shown schematically in FIG. 1A. The equivalent circuit 102 is shown as a single high voltage transistor in FIG. 1B. In embodiments of the invention described herein, the power transistor comprises a high voltage (HV) normally-on, depletion mode, GaN FET, which may comprise a GaN HEMT (High Electron Mobility Transistor) and the driver FET comprises a normally-off low voltage (LV) NMOS (N-channel) MOSFET.

The arrangement shown in FIGS. 1A and 1B may be viewed as a very high power microwave integrated hybrid device. As mentioned above, the GaN power transistor may, for example, be required to provide less than 20 nS switching time and more than 30 A current switching capability. In conventional arrangements using a discrete single N channel driver FET, such as shown in FIG. 1A, a "Kelvin Source Sense" or Kelvin connection SS is provided to enable an external driver device to more cleanly drive the intrinsic source, free of inductive L di/dt noise generated by the high current fluctuations of the source connection S.

Any significant series inductance at the MOSFET source (S) 120 or at the common node (Cn) 122 will provide unwanted L di/dt transients. Such transients can potentially be as large as the threshold voltage of devices—typically plus 2 V for the MOSFET and minus 3 V for a GaN HEMT or minus 7 V for a GaN MISFET, which would result in unwanted switching. Additionally, series resistance in the source connection 120 results in debiasing which produces an apparent increase of the on-resistance.

Figure 2:
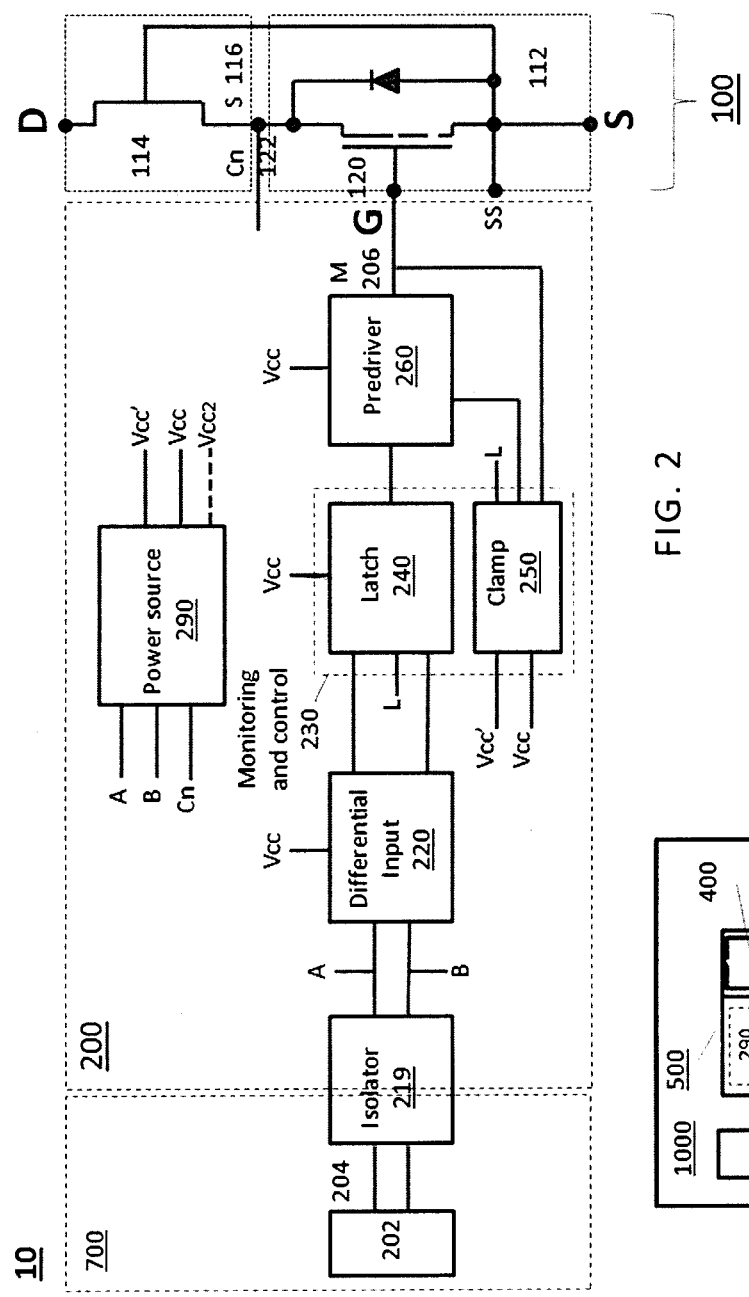
FIG. 2 shows a simplified circuit block diagram for a system comprising a driver circuit, according to a first embodiment of the present invention, for a power conversion circuit comprising a driver MOSFET that is series coupled, in a hybrid cascode arrangement, to the source of a HV power transistor comprising GaN HEMT.
Figure 2A:
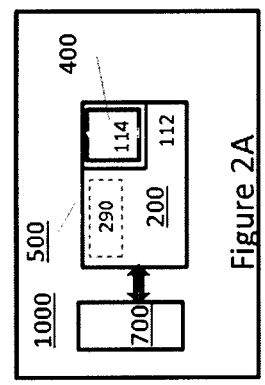
FIG. 2A (inset) shows a schematic representation of an integrated system comprising an interface circuit; a CMOS die carrying the driver circuit, an integrated driver MOSFET and power source; and a GaN die carrying the GaN HEMT.

As shown in FIG. 2, a system 10 comprising a driver circuit 200 for a hybrid cascode arrangement 100 of a normally-on GaN FET transistor and a normally-off driver MOSFET, according to a first embodiment of the invention, provides for improved monitoring and control of noise and transients, and enables a smaller driver MOSFET to be used. In turn, this allows for use of a low voltage, lateral MOSFET, which may be fabricated in standard CMOS and fully integrated with a CMOS driver circuit.

Driver Circuit Comprising Integrated Driver MOSFET

Figure 3:
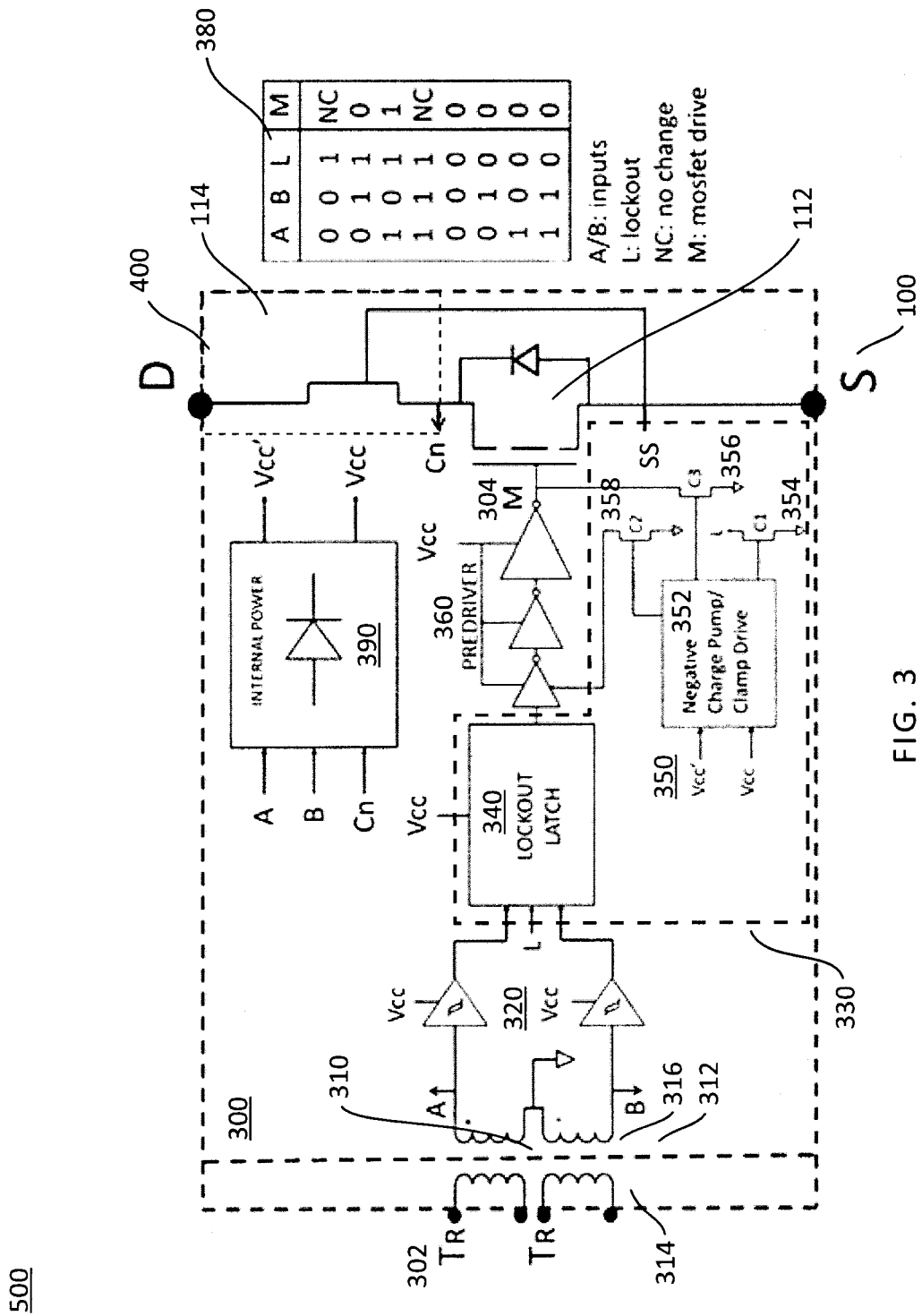
FIG. 3 shows a circuit schematic for a system, according to a preferred embodiment of the present invention, comprising a CMOS driver for a power conversion circuit comprising an integrated driver MOSFET that is series coupled, in a hybrid cascode arrangement, to the source of a HV power transistor comprising GaN HEMT.

A system 10 comprising a driver circuit 200, according to a first embodiment of the present invention, is shown schematically in the simplified block diagram in FIG. 2, and in more detail in the circuit schematic of FIG. 3.

The power transistor 100 comprises a hybrid cascode arrangement 100 similar to that shown in FIG. 1, comprising a driver MOSFET 112 and a GaN power transistor 114 comprising a GaN HEMT. Referring to FIG. 2, the control signal output 206 of driver circuit 200 is coupled to the gate 120 of the driver MOSFET.

As illustrated schematically in the simplified block diagram in FIG. 2, the system 10, comprising the driver circuit 200 comprises a differential input control signal generator 202 providing differential control signal inputs 204, which are coupled through an isolator 210 to differential input circuitry 220. The differential input circuitry 220 is then coupled to pre-driver circuitry 260 through monitoring and control circuitry 230. The monitoring and control circuitry 230 comprises latch circuitry 240 and clamp circuitry 250, as will be described in detail below. The control signal output 206 of the pre-driver circuitry 260 is connected to the gate of driver MOSFET 112, which is preferably fully integrated with the aforementioned components of the driver circuit.

Advantageously, the driver circuit 200 also includes a power source 290 for supplying a supply voltage Vcc, Vcc' to each of the circuit elements, as indicated. The power source preferably draws power internally from edge transitions of differential inputs A and B and from edge transitions of an input connection from the common node Cn 122, between the drain of the driver MOSFET and the source of the GaN power transistor 114.

The monitoring and control circuitry 230, comprising the latch circuitry 240 and clamp circuitry 250, is configured for monitoring the power inputs Vcc and Vcc' from the power source 290 and enables switching on of the driver MOSFET only when safe to do so, i.e. when Vcc and Vcc' inputs indicative of operational Vcc, Vcc' conditions are received. When the power is off, the clamp circuitry 250 holds the output to the gate of the driver MOSFET low. At power up, the control circuitry 230 monitors the Vcc and Vcc' inputs, and during power transitions and data input, the control circuitry is configured to continue to maintain the control signal output of the pre-driver circuitry to the gate of the driver FET low, thereby maintaining the driver FET off. Thus, the monitoring and control circuitry 230 controls the power sequencing to the switch so that the driver MOSFET is protected from transients during power up, power down and switching transitions. Thus, switching on of the driver MOSFET is enabled only when Vcc and Vcc' inputs indicative of stable or acceptable operational Vcc, Vcc' conditions are established.

The operation of the monitoring and control circuitry 230 will be described in more detail below with reference to FIG. 3, which illustrates a driver circuit 300 according to a preferred embodiment, which comprises an isolated, self-powered driver circuit with an integrated driver MOSFET. To facilitate comparison, elements of driver circuit 300 that are similar to those of driver circuit 200 are referred to by the same reference numerals incremented by 100.

As illustrated in the circuit schematic of FIG. 3, the driver circuit 300 comprises a differential control signal input 302, coupled through an isolator 310 comprising a coreless isolation pulse transformer to differential input circuitry 320, which comprises a Schmitt trigger differential input and envelope detector.

The differential input circuitry 320 is then coupled through monitoring and control circuitry 330, i.e. comprising latch circuitry 340 and clamp circuitry 350, to the pre-driver circuitry 360. The power source 390 draws power from differential inputs A and B and from the common node Cn and provides outputs Vcc and Vcc'. Optionally, the power source comprises one or more charge pumps, so that the Vcc output may comprise a plurality of outputs at different voltages, e.g. $Vcc_1$ and $Vcc_2$.

The monitoring and control circuitry 330 is configured so that the pre-driver (or pre-amp) 360 sees only differential edge transitions of differential inputs A and B, to enable switching of the driver MOSFET. On the other hand, the power source 390 is configured to draw power from non-differential edge transitions in inputs A and B. This process will be described in more detail in the section entitled "Power Harvesting".

The monitoring and control circuitry 330 comprises lockout latch circuitry 340 and clamp circuitry 350. The clamp circuitry 350 monitors inputs Vcc and Vcc' from the power source 390. It comprises a negative charge pump/clamp drive 352 coupled to the respective gates of a plurality of normally-on clamp transistors 354, 356 and 358. The outputs of clamp transistors 356 and 358 are coupled to the pre-driver and the control signal output of the pre-driver. The output of clamp transistor 354 is coupled to a latch input L of the lockout latch circuitry 340. To enable safe operation at start up and power down, the pre-driver output (M) 304 needs to be held low during all conditions of power transitions and input data. The three normally-on devices 354, 356 and 358 (C1, C2, C3) remain on until the negative charge pump/clamp drive 352 has established that the Vcc conditions are met. These clamps ensure that the driver MOSFET remains off when the power is off and switching is enabled only when acceptable Vcc conditions are established.

Another level of control is provided by the lockout latch circuitry 340 that comprises data storage D type latches. These latches are configured to provide an output to the pre-driver 360 dependent on differential inputs A and B and the latch input L, i.e. according to the truth table 380. Thus switching of the driver MOSFET can only occur with differential edge transitions in the differential inputs A and B, and when the latch input is also high, i.e. L=1. Thus, the control and monitoring circuitry is configured so that the pre-driver 360 effectively does not see non-differential edge transitions 11 and 00 of differential inputs A and B that are provided for use as a power source. In other words, when the input control signal comprises pulses or cycles comprising differential and non-differential transitions, the input control signal performs two functions. Switching control signals are encoded as differential edge transitions, for controlling the switching of the driver MOSFET, i.e. to provide gate control signals. Input control signals comprising non-differential transitions or pulses are supplied at a suitable envelope frequency, e.g. DC to tens of MHz, or more, as required for power harvesting by the power source from non-differential power transitions, i.e. to provide sufficient power to keep the CMOS driver circuit active. These parameters for power harvesting will be discussed in more detail below.

Thus, the latch circuitry 340 enables the switching transitions to be extracted or selected from the differential input control signal so that the pre-driver/pre-amp 360 does not see the non-differential transitions. At the same time the latch functions 340 and clamp functions 350 of the control circuitry 330 co-operate to provide monitoring of the power inputs Vcc and Vcc' from the power source 290, and enable switching on of the driver FET only when Vcc and Vcc' inputs indicative of safe or acceptable operational Vcc, Vcc' conditions are received. For high voltage, high current switching, the latch and clamp functions assist in providing multiple levels of control to enable safer switching.

When the power is off, clamp circuitry 350, including normally-on clamp transistor 352, holds the output to the gate of the driver MOSFET low. The latch input L is also low. During power up, the control circuitry 230 monitors the Vcc and Vcc' inputs, and during power transitions and data input the control circuitry is configured to continue to maintain the control signal output of the pre-driver circuitry to the gate of the driver FET low, thereby maintaining the driver FET off. Thus, the monitoring and control circuitry 230 controls the power sequencing to the switch so that the driver MOSFET is protected from transients during power up, power down and switching transitions. Switching on of the driver MOSFET is only enabled when Vcc and Vcc' inputs to the clamp circuitry meet operational Vcc, Vcc' conditions or requirements that allow unclamping and an output L=1 to the latch. Referring to the truth table, during switching transitions or data input, the on or off state of the driver MOSFET is not changed, unless differential inputs A, B are received, i.e. 1, 0 and the latch input L is 1. In this embodiment, the configuration of the latch circuitry is also key to operation of the internal power source.

Internal Power Source

Beneficially, the driver circuit 300 is self-powered by the internal power source 390. The power source is configured to draw power from differential inputs A and B and from an input connection from the common node Cn between the drain of the MOSFET drive transistor 112 and the source 116 of the GaN power transistor 114.

The isolator 310 is preferably implemented as a coreless transformer 312 for two reasons. Firstly, it is superior to conventional optocouplers in terms of jitter, ageing and delay. Secondly, it enables power to be drawn from input transitions by the power source 390.

As indicated above, the latch circuit 340 and clamp circuits 350 are configured to control the output of the pre-driver circuit M 304 as shown in the truth table 380. This truth table 380 is a key element of this system because it allows the logic inputs A and B to be continuously active as transitions. This allows for power transitions to be used as a source of secondary power, i.e. for power "harvesting".

As noted above, the control signal input may, for example, comprise an input signal comprising pulses of non-differential transitions for continuous cycling of the input signal when switching is not required, i.e. to enable power to be drawn from the transformer coupling of the input control signal. Unbalanced transitions, i.e. non-differential inputs A, B, are effectively ignored by the monitoring and control circuitry 230, as shown by the truth table 380. The latching circuitry 340 allows the output, M 304 to remain unchanged in the presence of the unbalanced (non-differential) drive signals. In addition, the pre-driver output (M) 304 needs to be kept low until the power source circuit is able to provide sufficient energy for the pre-driver 360 to properly control the rise and fall times of the clamp circuitry and enable the clamp circuit clamping action.

Non-differential edge transitions, 11 and 00, as shown in the truth table, produce no change in the condition of the large N-channel MOSFET 112, i.e. the device remains either 'on' or 'off'.

Thus, in this embodiment, the driver circuit provides monitoring and control functions similar to a Differential Data Receiver, which to the inventors' knowledge is unique for a power device of this type.

Power Harvesting

When the isolator comprises a transformer arrangement for each of the differential inputs A and B, if the power source comprises a rectifier, energy from transitions in the differential input may be "harvested". That is, the rectifier is configured to receive differential inputs A and B and they are cycled between 00 and 11. They provide a narrow pulse and a carrier signal that can be used to generate supply voltage outputs (Vcc and Vcc'). Differential inputs A and B supply initial start-up power to the driver circuit, and then during operation, power may also be drawn from the common node Cn of the cascode arrangement. Thus, the power source can generate the supply voltage needed by the low power control circuit to maintain its operational status.

However, after start up, the majority of the power drawn from the common node (Cn) 122. The common node Cn is needed as a power source because the N-channel MOSFET 112 has to provide an on-resistance as low as 10 to 15 milliohm. It therefore has a large gate capacitance with a significant charge requirement. This charge requirement can be provided by the pre-driver circuitry 260 once the operational Vcc supply is established.

Therefore, to switch the large driver MOSFET 112 rapidly on and off, significant current will be drawn from the Vcc supply. The pulse transformers 312 of isolator 310 are able to provide the input control signal, some modest energy transfer and isolation. Since the transformer energy transfer is limited, the additional power that is drawn from the common node (Cn) 122 is an important contributor.

Interface Circuit

Figure 4:
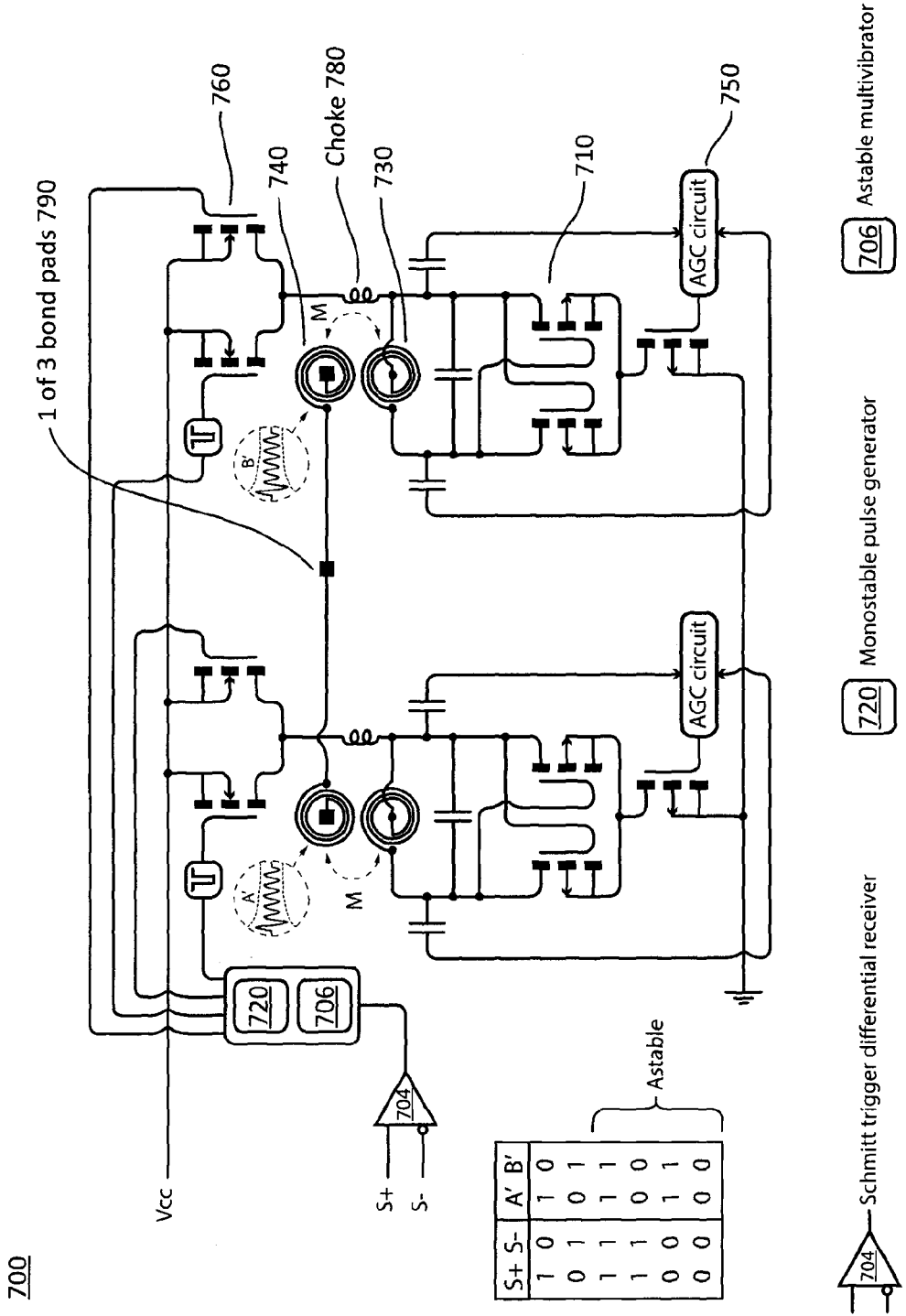
FIG. 4 shows a circuit schematic for an interface circuit according to an embodiment of the invention.

As described above, the power harvesting across the transformer coupling depends on two pieces of the system working together: (a) the internal logic in the driver circuit 200 and (b) the function generator (pulse generator) 202 on the input side of the isolation transformer. Thus, as shown in FIG. 4 an interface circuit 700 according to an embodiment of the invention is shown. The interface circuit 700 incorporates a cross coupled push-pull oscillator 710 that has a spiral resonant tank circuit 720 with primary winding 730, preferably implemented as a CMOS integrated circuit. The resonant tank circuit 720 has a closely coupled secondary spiral winding 740 (see also, e.g. primary and secondary windings 314 and 316 in FIG. 3) to form a pulse transformer isolation arrangement. When the circuit is fabricated as a CMOS integrated circuit, the transformer isolation 742 may comprise, for example, a series of deposited polyimide layers, 20-25 microns thick, that define the width of the metal lines that form the primary and secondary spiral windings 730 and 740.

When the circuit 700 is powered by a differential input signal or command X, Y the push-pull oscillator is enabled and it provides a continuous 100-500 MHz output. The transformer outputs are coupled, by wirebonding, to respective input pads of the CMOS driver circuit 500. This energy is coupled to the driver circuit 200 of the GaN FET 114 via the secondary spiral winding 740 (i.e. element 316 in FIG. 3). As shown in FIG. 4, an Automatic Gain Control (AGC) circuit 750 is provided. This circuit limits the oscillation aptitude so that the push-pull oscillator produces a near sine wave—that produces low harmonic content. By this means, the Electromagnetic Interference issues that plague power/signal transfer systems of this kind are reduced. However the AGC circuit 750 does not provide optimum start-up conditions for the oscillator to minimize the overall system delay. Thus, PMOS and NMOS oscillator control devices 760, 770 are also used. Two PMOS devices, of different sizes, are used to provide on/off control of the oscillator while the NMOS device provides AGC control. The larger PMOS device initiates the oscillation while the smaller device sustains the oscillation. This arrangement allows the AGC circuit to operate within its limited range because the smaller PMOS device acts as a current limiter.

Alternative Embodiments

In the system 10 comprising a driver circuit 300, according to the embodiment described above, the driver MOSFET is preferably a large, low voltage, lateral MOSFET that can be fabricated using a standard CMOS process, and thus it can be fully integrated with a CMOS driver circuit. One of the benefits of using a fully integrated CMOS driver circuit is that minimal power is required to maintain the CMOS driver circuit on.

Where the driver MOSFET is fully integrated with the driver circuit on the same substrate chip or die, the on chip driver MOSFET source connections implicitly provide for monitoring of the source of the driver MOSFET, and a conventional Kelvin Source Connection is not required.

It will be appreciated that in other embodiments, the driver MOSFET may be a discrete MOSFET, either a lateral or vertical driver MOSFET. In this case the hybrid cascode arrangement of the GaN power transistor and the driver MOSFET is provided with a conventional Kelvin Source Sense connection SS, as indicated in FIG. 1, for source monitoring and coupling to the driver circuit.

Whether or not the driver MOSFET is integrated with the driver circuit, beneficially, in preferred embodiments, all driver circuit elements, are fully integrated in a CMOS implementation of the driver circuit. On the other hand, in alternative embodiments, it will be appreciated that while some elements of the circuit are integrated, e.g. the power source, other elements of the circuit may be provided by discrete or separate components, and any appropriate semiconductor technologies may be used for these components.

If an internal power source is not required, e.g. if a separate isolated power supply is provided, the isolator may comprise an optical isolator or optocoupler or, alternatively, a high speed digital isolator. However, as described above, for a self-powered driver circuit, a transformer isolation arrangement is preferred, to allow for "power harvesting", i.e. power drawn by a rectifier in the power source from non-differential edge transitions in the input control signal. Alternatively, another suitable isolator that allows for power transfer, or "power harvesting" for isolated, self-powering of the driver circuit, may be used. When such an arrangement is implemented, a separate, external isolated power supply is not required.

In embodiments comprising an internal power source, the power source may comprise one or more charge pumps to boost the supply voltage, i.e. to provide a higher voltage to drive the gate of the driver FET more fully on. If required, the supply voltage output is provided at two or more different voltages, i.e. $Vcc_1$ and $Vcc_2$. For example, it may be desirable to drive the latch circuitry at 3V, and drive the gate of the driver FET on at a higher voltage, e.g. 5V or 10V or more, to provide a lower on-resistance, and achieve a higher voltage on the common node.

As described with reference to FIG. 3, the differential input circuitry preferably comprises a Schmitt trigger arrangement to clean up transition edges and noise in the input control signals. The Schmitt trigger arrangement responds to the envelope of the carrier signal and not the carrier itself. Other suitable differential input circuitry may be used.

Specific implementations of the latch and clamp circuitry are described with reference to FIG. 3, i.e. using D type latches configured to implement the truth table as shown. Other suitable arrangements, with equivalent functionality may be used. For example, the latch functions may, alternatively, be implemented using bipolar transistor circuitry.

In the preferred embodiment of the switching system described above, the power transistor comprises a normally-on HV GaN HEMT. The power transistor may alternatively be another type of GaN MISFET. The normally-off driver FET is not limited to a MOSFET.

For example, where the power transistor is an normally-on GaN transistor such as a GaN HEMT, the driver FET may, for example, be a low voltage, normally-off GaN FET, which can provide 3 times the FOM of a normally-off silicon MOSFET Thus the power transistor may comprise a cascode arrangement of a normally-on HV GaN transistor and a normally-off LV GaN FET.

If required a clamp may also be provided at the common node, i.e. at the drain of the driver FET. For example, this clamp may comprise a string of diodes, or a Zener diode arrangement e.g. comprising a 4V Zener diode. This may be desirable when using a low voltage MOSFET driver, to prevent the common node/drain voltage of the driver FET rising too high, and over-stressing the MOSFET device.

Optionally, an additional pre-driver output can be provided that drives the gate of the GaN transistor positive when the structure is in the on-state.

In another alternative embodiment, the GaN FET is fabricated with a more negative gate threshold. This arrangement results in a higher positive voltage being required on the GaN source node when the GaN gate is grounded, as it is in the cascode circuit arrangement. Typical standard GaN gate threshold voltages are around −3 V whereas the higher threshold devices are around −7 V. This higher GaN source voltage can also be used to harvest power and in this instance, it would be at a higher voltage. Therefore it reduces the requirement for a charge pump to increase the harvested voltage. Typically NMOS transistors will have lower on-resistance when driven with higher gate voltages and since the gate voltage is determined by the supply voltage on the driver, which is derived from the harvested voltage, it is preferred to have this voltage well over 5 volts and typically closer to 10 V or even higher. Therefore, increasing the GaN gate threshold provides a higher harvested voltage to directly drive the NMOS FET to have a lower on-resistance. Thus, although a higher (more negative) threshold voltage GaN device would not be compatible for full integration with the 5V CMOS NMOS devices, it provides some other benefits.

CMOS Driver Circuit Implementation

Figure 5:
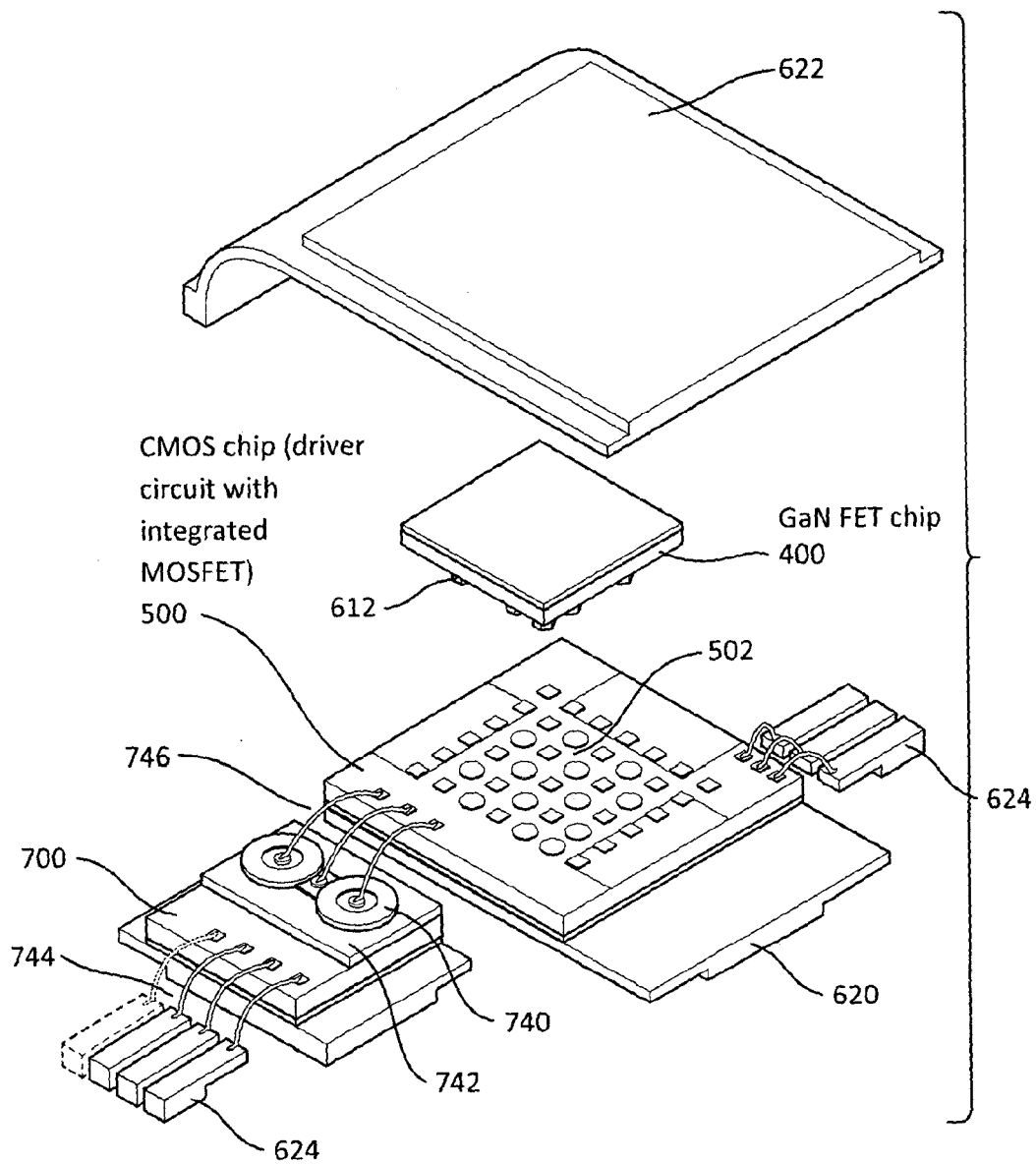
FIG. 5 shows an exploded view of a physical implementation of a system according to an embodiment of the invention.

A schematic exploded view of a system 1000 of elements packaged assembly of a chip 400 comprising a GaN FET 114, a CMOS driver chip 500 comprising a CMOS driver circuit 200 with an integrated driver MOSFET 112, and an interface circuit 700 is shown in FIG. 5. This arrangement is described in detail in the above referenced related copending US provisional patent application.

The interface circuit 700 comprises pulse generation circuitry 710 for generating the differential input control signals, which are coupled through the isolation transformer coupling 740 to the CMOS driver chip.

The GaN chip 400 is interconnected to the CMOS driver chip 500, in a flip-chip type configuration, using a plurality of low inductance interconnections, comprising copper posts 612. Also shown are some of the packaging elements of a Power Quad Flat No Lead (PQFN) type package, including large area upper and lower copper lead frames 620, and 622, for electrical connections. Each lead frame 620 and 622 also comprises an integral heat spreader for thermal management.

In fabricating the CMOS chip comprising a driver circuit comprising an integrated driver MOSFET, or a discrete driver MOSFET, it is desirable to provide a low inductance source electrode and reduce the series inductance and resistance of the cascode arrangement.

As described in the above referenced PCT application PCT/CA2012/000080, the GaN transistor may comprise an Island Topology™ GaN HEMT transistor. Using this topology, the GaN transistor effectively comprises a large number of interconnected transistor elements, i.e. connected in parallel, and is provided with a plurality, e.g. 12 large area source contacts 612 on the top side of the chip.

Beneficially, the LV driver MOSFET 112 is fabricated using a standard CMOS process technology. Such a device may then be fully integrated with the driver circuit 200, on a CMOS integrated circuit chip 500. As shown schematically in FIG. 5, the CMOS driver chip 500 comprising a large area N-channel MOSFET, comprises a plurality of front side/on-chip drain contact pads, using an Island Topology™ contact arrangement 502, similar to that of the GaN device 400. These contact arrangements enable the two die to be directly interconnected in a stacked, flip-chip configuration, using multiple low inductance and low resistance connections 612, e.g. copper posts, directly interconnecting the two devices, as illustrated in FIG. 5.

In particular, by providing an island contact topology for both the GaN transistor and the driver MOSFET, multiple low inductance and low resistance drain/source interconnects can be provided between the two die to interconnect the GaN transistor and the driver MOSFET in a hybrid cascode arrangement. Additionally the driver MOSFET is provided with a low inductance backside source connection and the GaN transistor has a low inductance backside drain connection. Thus, a hybrid cascode arrangement can be provided with significantly reduced series resistance and inductance relative to conventional wire bonded interconnect between discrete devices.

FIG. 6 shows a cross-sectional view through an assembly of the elements shown in FIG. 5. That is, the assembly comprises the GaN die 400 comprising the GaN HEMT, the CMOS driver die 500 comprising the integrated driver MOSFET, and the interface circuit 700 with the isolation transformer coupling.

FIG. 6B shows an enlarged cross-sectional view showing the primary spiral winding 730 and secondary spiral winding 740, and polyimide isolation 742 of the isolation transformer coupling. Wirebonds 744 are provided from input pins 624 to the input of the interface circuit 700, and wirebonds 746 are provided from the output of the transformer coupling to the input pads of the CMOS driver chip.

In particular, when the GaN transistor is fabricated using GaN Systems Island Topology™, interconnection of the GaN power transistor and the driver MOSFET may be made with a plurality of, e.g. 12, copper posts to minimize inductance of the interconnect between the NMOS drain and the GaN source.

This structure can be fabricated using custom layouts within design rules of open CMOS technology and open GaN technology from foundry suppliers. A standard CMOS process can readily provide a large area NMOS device with a performance equivalent to a discrete vertically structured low voltage power transistor. For example, for commercially available lateral transistor structures, providing the voltage requirement is limited to 15V, a conventional CMOS process provides performance more than adequate for the task.

Other Design Considerations

Another important factor is the breakdown voltage of the device, i.e. which would lead to avalanche effects. Any significant inductance between the MOSFET drain and the GaN device source will produce an overvoltage condition after turn-off. Thus, reducing the inductance and controlling the slew rate of the MOSFET device is important. The driver circuit shown in FIGS. 2 and 3, comprising latching, clamping and power functions can provide a significant measure of control. In the simplified schematics shown in FIGS. 2 and 3, only one gate connection is shown to the N-channel driver MOSFET. As illustrated in FIG. 5, when using devices are fabricated with island topology and multiple interconnects, if the device structure comprises multiple gate connections, a clamp is provided on each of the multiple, e.g. 12, gate interconnections. Correspondingly, if the driver MOSFET comprises multiple drain connections to multiple source connections of the GaN power device, if clamping of the common node Cn is provided, multiple clamps to each connection may be required.

Another issue is the control of the EMC/EMI issues resulting from the dv/dt behavior at the drain of the GaN device. It cannot be assumed that the slew rate control provided by the MOSFET control chip can alone optimize the tradeoff between EMC/EMI issues and speed requirements. Because the GaN HEMT drain/source capacitance does not appreciably change over even a 1000-volt transition, this capacitance can provide the basis of a well-defined Miller feedback to the gate of the MOSFET via its gate/drain capacitance. The drive level and the output resistance of the control circuit driving the MOSFET can be tailored to produce the best tradeoff between EMC/EMI issues and switching speed.

Initial power switch evaluations are usually based upon the inverse FOM: $Q_g$*Ron (ohm.nC). Device designers regard this traditional FOM as simplistic since it only peripherally relates to current limits, thermal factors, and ease of use. However, because FOM is a familiar concept, it is a useful parameter to compare GaN transistors and the cascode MOSFET/GaN hybrid structures described above.

The FOM performance for MOSFETs, SJ MOSFETs, SiC and GaN devices has been reported in the literature. The FOM performance of a MOS/SiC cascode structure has also recently been reported. It is apparent that GaN transistors will typically provide an order of magnitude performance advantage over all type of MOSFET devices. Lateral GaN power transistors have been reported to achieve between 50V and 75V per micron of gate/drain spacing. It projected that GaN transistors will achieve 100 V per micron in the near term.

The intense current interest in GaN transistors has been triggered by this projected performance. However, the best-performing SiC and GaN transistors are depletion mode, i.e. normally-on, types. By comparison, a normally-off (enhancement mode) device provides degraded performance. The cascode approach is therefore a valuable method of providing the required normally-off behavior without compromising performance, and is applicable to both SiC and GaN devices. The smaller gate voltage swing required by GaN HEMT devices, e.g. 5V compared to 15-30V required by some SiC devices, allows standard CMOS processes to be used for the GaN driver circuitry as disclosed herein. This is a significant advantage. Additionally, a monolithic cascode using a high voltage normally-on GaN HEMT integrated with a low voltage normally-off GaN driver device would potentially offer an exceptional performance. It would also be relatively easy to drive with a small CMOS integrated circuit, as described above.

INDUSTRIAL APPLICABILITY

GaN transistor switches can provide switching speeds of a few nanoseconds and two orders of magnitude improvement in specific on-resistance relative to silicon devices. These advantages provide for improved conversion efficiencies in applications for power systems, such as solar and wind inverters.

Systems and devices comprising driver circuits are disclosed, which are particularly applicable for driving high performance depletion mode GaN transistors, for applications for power conversion circuits. In preferred embodiments, the system comprises a cascode arrangement of a normally-on GaN HEMT and a normally-off driver MOSFET in which the driver MOSFET is preferably a large area, lateral MOSFET fully integrated with CMOS drive circuitry. The integrated device driver circuit is preferably low power and high speed, and provides features such as a latch circuitry and clamp circuitry and improved control of voltage transients and noise, to enable safe operation during power-up and power-down transitions.

In comparison, conventional GaN cascode designs use off-the-shelf vertical MOSFET power devices as drivers. Such devices cannot be integrated into a standard CMOS process sequence. Thus, the conventional approach, using discrete vertical MOSFETs, does not enable integration with a CMOS driver circuit as described herein.

Advantageously, as disclosed in the above referenced related copending US provisional patent application, arrangements are provided for co-packaging a first substrate (die) comprising the CMOS drive circuitry with integrated driver MOSFET and a second substrate (die) comprising the GaN HEMT, with direct low inductance interconnections and effective heat management. This arrangement addresses issues with series inductance and resistance, and thermal resistance.

Preferred embodiments of a system and device comprising a driver circuit with integrated drive MOSFET provide isolation, reduced input losses, high speed operation, and enable shut-down and start-up conditioning. Low power operation of the CMOS driver circuit enables the circuit to be powered by an internal integrated power source, using energy harvesting, thus eliminating the need for an isolated external power supply. Embodiments of the system offer one or more advantages for system performance and/or reliability.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A driver circuit for a hybrid cascode arrangement of a normally-on power transistor driven by a normally-off driver field effect transistor (FET), the driver circuit comprising:
   a differential control signal input;
   a gate control signal output for coupling to a gate of the driver FET;
   the differential control signal input being coupled to differential input circuitry;
   the output of the differential input circuitry being coupled through monitoring and control circuitry to a pre-driver providing the gate control signal output;

a power source for supplying an operational supply voltage Vcc, Vcc'; and the monitoring and control circuitry comprising latch circuitry and clamp circuitry configured to:
  during power off, clamp the output control signal to maintain the driver FET off
  monitor Vcc and Vcc' inputs from the power source;
  enable switching of the driver FET only when Vcc and Vcc' inputs indicative of operational Vcc, Vcc' conditions are received; and
  otherwise lockout switching of the driver FET
wherein the clamp circuitry comprises:
  a negative charge pump, and a plurality of normally-on transistor clamps,
  the transistor clamps being coupled respectively to the gate control signal output of the pre-driver circuitry, an input of the pre-driver, and a latch input L of the latch means,
wherein the negative charge pump receives inputs Vcc and Vcc' and provides outputs to gates of the transistor clamps, based on said Vcc and Vcc' inputs, to enable switching off of the transistor clamps only when operational Vcc and Vcc' conditions are established.

2. The driver circuit of claim 1, wherein the latch circuitry receives differential input control signals A and B, from the differential input circuitry, and wherein the latch circuitry is configured such that non-differential edge transitions inputs A and B to the latch circuitry produce no change in the output control signal.

3. The driver circuit of claim 2, wherein the latch circuitry further receives an input L from the clamp circuitry, and wherein the latch circuitry is configured such that, unless an input L indicative of operational Vcc and Vcc' conditions is received, no change in the output control signal is produced.

4. The driver circuit of claim 3, wherein the output control signal of the latch circuitry is based on a truth table

| A | B | L | M |
|---|---|---|---|
| 0 | 0 | 1 | NC |
| 0 | 1 | 1 | 0 |
| 1 | 0 | 1 | 1 |
| 1 | 1 | 1 | NC |
| 0 | 0 | 0 | 0 |
| 0 | 1 | 0 | 0 |
| 1 | 0 | 0 | 0 |
| 1 | 1 | 0 | 0 | wherein A and B are the differential control signal inputs, L is the input from the clamp circuitry, M is the gate drive control signal for the driver FET and NC means no change.

5. The driver circuit of claim 1, wherein the differential input circuitry comprises a Schmitt trigger differential input and an envelope detector.

6. The driver circuit of claim 1, wherein differential signal inputs are coupled to the differential input circuitry through isolator circuitry comprising a coreless or air core isolation transformer coupling.

7. The driver circuit of claim 6, wherein the power source is configured to draw power from non-differential edge transitions of differential inputs A, B from the transformer coupling and/or from a common node Cn of the hybrid cascode arrangement.

8. The driver circuit of claim 7, wherein the power source comprises a rectifier configured to receive differential inputs A and B from the transformer coupling, such that cycling of differential control inputs A and B between 00 and 11 non-differential edge transitions provides a narrow pulse and a carrier signal to generate supply voltage outputs Vcc and Vcc'.

9. The driver circuit of claim 7, wherein the power source further comprises at least one charge pump for boosting the supply voltage.

10. The driver circuit of claim 9, comprising a plurality of charge pumps for supplying a plurality of outputs at different supply voltages, comprising $Vcc_1$ and $Vcc_2$.

11. The driver circuit of claim 1, wherein the monitoring and control circuitry further comprises clamp circuitry having an output for clamping a common node of the hybrid cascode arrangement to limit the drain voltage of the driver FET.

12. The driver circuit of claim 1, wherein the driver circuit comprises a CMOS integrated circuit.

13. The driver circuit of claim 1, wherein the power source is integrated as part of the CMOS integrated circuit.

14. The driver circuit of claim 1, wherein the driver circuit comprises a CMOS integrated circuit for driving a driver FET comprising a low voltage driver MOSFET.

15. The driver circuit of claim 1, wherein the driver circuit comprises a CMOS integrated circuit for driving a driver FET comprising a normally-off low voltage GaN FET.

16. The driver circuit of claim 1, wherein the driver circuit comprises a CMOS integrated circuit and the driver FET of the hybrid cascode arrangement comprises a lateral MOSFET monolithically integrated with the driver circuit.

17. The driver circuit of claim 1, wherein the circuit is configured for operation with a normally-on power transistor comprising a GaN FET having a −3 V threshold voltage.

18. The driver circuit of claim 1, wherein the circuit is configured for operation with a normally-on power transistor comprising a GaN FET having a −7V threshold voltage, for providing an output control signal to the gate of the driver FET at greater than 5 V, and preferably at 10V or higher.

19. A system comprising:
  a power transistor switch comprising a cascode arrangement of a normally-on depletion mode high voltage power transistor driven by a normally-off drive FET; and
  a driver circuit as
  the driver circuit comprising:
    a differential control signal input;
    a gate control signal output coupled to the gate of the driver FET;
    the differential control signal input being coupled to differential input circuitry;
    the output of the differential input circuitry being coupled through monitoring and control circuitry to a pre-driver providing the gate control signal output;
    a power source for supplying an operational supply voltage Vcc, Vcc'; and
    the monitoring and control circuitry comprising latch circuitry and clamp circuitry configured to:
      monitor Vcc and Vcc' inputs from the power source;
      during power off, clamp the output control signal to maintain the driver FET off;
      enable switching of the driver FET only when Vcc and Vcc' inputs indicative of operational Vcc, Vcc' conditions are received; and
      otherwise lockout switching of the driver FET
    wherein the clamp circuitry comprises:
      a negative charge pump, and a plurality of normally-on transistor clamps, the transistor clamps being coupled respectively to the gate control signal output of the pre-driver circuitry, an input of the pre-driver, and a latch input L of the latch means, wherein the negative charge pump receives inputs Vcc and Vcc' and provides outputs to gates of the transistor clamps, based on said Vcc and Vcc' inputs, to enable switching off of the transistor clamps only when operational Vcc and Vcc' conditions are established.

20. The system of claim 19, wherein the power transistor comprises a normally-on GaN FET.

21. The system of claim 19, wherein the driver circuit comprises a CMOS integrated circuit and the driver FET of the hybrid cascode arrangement comprises a lateral MOSFET monolithically integrated with the driver circuit.

22. The system of claim 19, wherein the power transistor comprises a normally on GaN FET having a −3 V threshold voltage.

23. The system of claim 19, wherein the power transistor comprises a GaN FET having a −7V threshold voltage, and the driver circuit is configured to output a gate control signal to the gate of the driver FET at greater than 5V, and preferably at 10V or higher.

24. The system of claim 19 further comprising an interface circuit comprising a differential input signal generator and isolation circuitry for coupling the input control signal to the differential input circuitry.

25. The system of claim 24, wherein the isolation circuitry comprises an isolation transformer coupling.

26. A system for generating a switching control signal for driving a power transistor comprising a hybrid cascode arrangement of a normally on power transistor driven by a normally-off driver FET, comprising:
an input signal generator for generating differential input control signals A and B comprising a series of pulses comprising differential edge transitions and non-differential edge transitions;
input isolation comprising a transformer coupling for receiving differential input control signals A and B;
a driver circuit comprising an internal power source for supplying an operational supply voltage Vcc, Vcc', a pre-driver for outputting a gate control signal to the gate of the driver FET, and monitoring and control circuitry;
the internal power source of the driver circuit comprising power harvesting circuitry for receiving inputs A and B and drawing power from pulses comprising non-differential edge transitions of inputs A and B for generating the operational supply voltage Vcc and Vcc';
the monitoring and control circuitry comprising latch circuitry for receiving inputs A and B and extracting from differential edge transitions a switching control signal; and
an output of the monitoring and control circuitry being coupled to the pre-driver circuitry for coupling the switching control signal to a gate of the driver FET.

27. The system of claim 26, wherein the monitoring and control circuitry further comprises:
clamp circuitry for clamping the switching control signal, the clamp circuitry being configured for monitoring the supply voltage Vcc and Vcc' and:
during power off, for clamping the switching control signal to maintain the power transistor off;
for unclamping the switching control signal for switching of the power transistor when Vcc and Vcc' inputs indicative of operational Vcc, Vcc' conditions are received; and
otherwise for clamping the switching control signal.

28. A system according to claim 27, wherein the power harvesting circuitry further comprises one or more charge pumps for boosting the output supply voltage Vcc.

29. A system according to claim 27, wherein the internal power source comprises at least two charge pumps for generating outputs of at least two different output supply voltages $Vcc_1$ and $Vcc_2$.

30. An interface circuit for the driver circuit of claim 1, comprising:
a pulse generator for generating differential input control signals A and B comprising a series of pulses comprising differential edge transitions and non-differential edge transitions; and
isolation means coupling the differential input control signals A and B to outputs of the interface circuit wherein the isolation means comprises a pulse transformer isolation arrangement and the pulse generator provides differential input control signals A and B at 100-500MHz;
the differential input control signals being coupled through automatic gain control circuitry to a cross coupled push-pull oscillator having spiral resonant tank circuit with a primary winding and a closely coupled secondary spiral winding forming the pulse transformer isolation arrangement; and
the secondary winding of the transformer isolation arrangement being coupled to differential control signal outputs of the interface circuit.

31. The interface circuit of claim 30 fabricated as a CMOS integrated circuit.

32. The interface circuit of claim 31, wherein primary and secondary spiral windings are fabricated by metal interconnect layers of the CMOS integrated circuit, and the transformer isolation comprises a series of deposited polyimide layers defining the width of metal lines forming the primary and secondary spiral windings.

33. A driver circuit for a power transistor switch comprising a hybrid cascode arrangement of a normally-on GaN power transistor driven by a normally-off driver field effect transistor (FET), the driver circuit comprising:
a differential control signal input;
a gate control signal output for coupling to a gate of the driver FET;
the differential control signal input being coupled to differential input circuitry;
the output of the differential input circuitry being coupled through monitoring and control circuitry to a pre-driver providing the gate control signal output;
a power source for supplying an operational supply voltage Vcc, Vcc'; and
the monitoring and control circuitry comprising latch circuitry and clamp circuitry configured to:
during power off, clamp the output control signal to maintain the driver FET off;
monitor Vcc and Vcc' inputs from the power source;
enable switching of the driver FET only when Vcc and Vcc' inputs indicative of operational Vcc, Vcc' conditions are received; and
otherwise lockout switching of the driver FET wherein the latch circuitry receives differential input control signals A and B from the differential inputs and is configured such that non-differential edge transitions inputs A and B to the latch circuitry produce no change in the output control signal, wherein the latch circuitry further receives an input from the clamp circuitry and is configured such that, unless an input L indicative of operational Vcc and Vcc' conditions is received, no change in the output control signal is produced, and wherein the output control signal of the latch circuitry is based on a truth table,

| A | B | L | M |
|---|---|---|---|
| 0 | 0 | 1 | NC |
| 0 | 1 | 1 | 0 |
| 1 | 0 | 1 | 1 |
| 1 | 1 | 1 | NC |
| 0 | 0 | 0 | 0 |
| 0 | 1 | 0 | 0 |
| 1 | 0 | 0 | 0 |
| 1 | 1 | 0 | 0 | where M is the output gate drive control signal for the driver FET, and where NC means no change.

* * * * *